US006833299B2

(12) United States Patent
Coolbaugh et al.

(10) Patent No.: US 6,833,299 B2
(45) Date of Patent: Dec. 21, 2004

(54) METHOD OF FABRICATING A STACKED POLY-POLY AND MOS CAPACITOR USING A SIGE INTEGRATION SCHEME

(75) Inventors: Douglas D. Coolbaugh, Essex Junction, VT (US); James Stuart Dunn, Jericho, VT (US); Stephen Arthur St. Onge, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/292,204

(22) Filed: Nov. 12, 2002

(65) Prior Publication Data

US 2003/0092239 A1 May 15, 2003

Related U.S. Application Data

(62) Division of application No. 09/551,168, filed on Apr. 17, 2000, now Pat. No. 6,507,063.

(51) Int. Cl.[7] .................. H01L 21/8244; H01L 21/8242
(52) U.S. Cl. ...................... 438/238; 438/239; 438/240; 438/258; 438/250; 438/251; 438/384; 438/393
(58) Field of Search .................. 438/397, 238–241, 438/250–251, 258, 386, 393, 399, 384, 593

(56) References Cited

U.S. PATENT DOCUMENTS

| | | | |
|---|---|---|---|
| 4,246,502 A | 1/1981 | Kubinec | |
| 4,434,433 A | 2/1984 | Nishizawa | |
| 4,805,071 A | 2/1989 | Hutter et al. | |
| 4,914,546 A | 4/1990 | Alter | |
| 4,989,056 A | 1/1991 | Hiraiwa et al. | |
| 5,082,797 A | 1/1992 | Chan et al. | |
| 5,119,267 A | 6/1992 | Sano et al. | |
| 5,162,890 A | 11/1992 | Butler | |
| 5,206,788 A | 4/1993 | Larson et al. | |
| 5,236,859 A | * 8/1993 | Bae et al. | 438/397 |
| 5,389,560 A | * 2/1995 | Park | 438/397 |
| 5,583,359 A | 12/1996 | Ng et al. | |
| 5,602,051 A | 2/1997 | Cronin et al. | |
| 5,804,853 A | 9/1998 | Cronin et al. | |
| 5,814,852 A | 9/1998 | Sandhu et al. | |
| 5,918,119 A | 6/1999 | Huang | |
| 5,962,879 A | 10/1999 | Ryum et al. | |
| 5,970,338 A | * 10/1999 | Tempel | 438/241 |
| 5,986,298 A | 11/1999 | Yoo | |
| 6,060,366 A | * 5/2000 | Hong | 438/397 |
| 6,072,160 A | * 6/2000 | Bahl | 219/405 |
| 6,514,842 B1 | * 2/2003 | Prall et al. | 438/593 |

FOREIGN PATENT DOCUMENTS

JP  05211288  8/1993

OTHER PUBLICATIONS

Wolf "Silicon Processing for the VLSI Era", vol. 1, pp. 182–186, 198.*
Ghandhi, "VLSI Fabrication Principles: Silicon and Gallium Arsenide", 2nd ed, 1994, pp. 537.
Van Zant, "Microchip Fabrication: A Practical Guide to Semiconductor Processing", 4th ed., 2000, McGraw Hill, New York, pp. 404–405.

* cited by examiner

*Primary Examiner*—Thanh Nguyen
(74) *Attorney, Agent, or Firm*—Scully, Scott, Murphy & Presser; William D. Sabo, Esq.

(57) ABSTRACT

A stacked Poly-Poly/MOS capacitor useful as a component in a BiCMOS device comprising a semiconductor substrate having a region of a first conductivity-type formed in a surface thereof; a gate oxide formed on said semiconductor substrate overlaying said region of first conductivity-type; a first polysilicon layer formed on at least said gate oxide layer, said first polysilicon layer being doped with an N or P-type dopant; a dielectric layer formed on said first polysilicon layer; and a second polysilicon layer formed on said dielectric layer, said second polysilicon layer being doped with the same or different dopant as the first polysilicon layer.

12 Claims, 2 Drawing Sheets

METHOD OF FABRICATING A STACKED POLY-POLY AND MOS CAPACITOR USING A SIGE INTEGRATION SCHEME

RELATED APPLICATIONS

This application is a divisional of U.S. application Ser. No. 09/551,168, filed Apr. 17, 2000 now U.S. Pat. No. 6,507,063.

FIELD OF THE INVENTION

The present invention relates to a BiCMOS, i.e., bipolar and complementary metal oxide semiconductor (CMOS), device, and in particular to a BiCMOS device in which the capacitor component thereof comprises a stacked polysilicon—polysilicon (Poly—Poly)/metal oxide semiconductor (MOS) capacitor. The present invention also provides a method of fabricating a stacked Poly—Poly/MOS capacitor in which the processing steps thereof can be integrated into various BiCMOS integration schemes.

BACKGROUND OF THE INVENTION

In the field of semiconductor device manufacturing, CMOS (complementary metal oxide semiconductor) and BiCMOS (bipolar device and complementary metal oxide semiconductor) technologies have been widely used for integrating highly complex analog-digital subsystems onto a single chip. In such subsystems, high precision capacitors are typically required.

Several types of capacitors are available including Poly—Poly capacitors, MOS capacitors (also referred to in the art as diffusion-Poly capacitors), and metal—metal capacitors. In order to meet the demand for high precision capacitors in today's generation of integrated devices, Poly—Poly capacitors have been increasingly used.

Despite its high precision, a Poly—Poly capacitor is a compromise between high cost and ideal capacitor characteristics since it is relatively easy to construct, and has electrical characteristics better than MOS capacitors, but inferior electrical characteristics to metal—metal capacitors. However, metal—metal capacitors are much more difficult to fabricate than are Poly—Poly capacitors.

Moreover, Poly—Poly capacitors are known to have a more linear V-C relationship than MOS capacitors. The dielectric for MOS capacitors results from an oxide that is thermally grown over a highly doped diffusion region. In contrast, the dielectric for a Poly—Poly capacitor is generally a deposited CVD oxide and reliability requirements cause the resulting oxide to be thicker than can be realized with a thermal oxide. Therefore, higher capacitance values generally result for MOS capacitors than Poly—Poly capacitors.

In view of the above remarks concerning Poly—Poly capacitors, it would be extremely beneficial if a Poly—Poly capacitor was developed that has improved capacitance per unit area. This goal is obtained in the present invention by stacking a Poly—Poly capacitor on top of a MOS capacitor. Such a capacitor is extremely useful in integrated and mixed signal applications.

SUMMARY OF THE INVENTION

One object of the present invention is to provide a BiCMOS device that includes at least a stacked Poly—Poly/MOS capacitor therein.

Another object of the present invention is to provide a stacked Poly—Poly/MOS capacitor that has a high capacitance associated therewith.

A further object of the present invention is to provide a stacked Poly—Poly/MOS capacitor that has a high voltage associated therewith.

A yet further object of the present invention is to provide a stacked Poly—Poly/MOS capacitor that can be fabricated utilizing process steps that can be easily integrated into existing BiCMOS processing schemes.

These and other objects and advantages are achieved in the present invention by forming a Poly—Poly capacitor on top of a MOS capacitor utilizing the top electrode of the MOS capacitor as the base electrode of the Poly—Poly capacitor.

In one aspect of the present invention, a stacked Poly—Poly/MOS capacitor having the above features is provided Specifically, the stacked Poly—Poly/MOS capacitor of the present invention comprises:

a semiconductor substrate having a region of a first conductivity-type formed in a surface thereof;

a gate oxide formed on said semiconductor substrate overlaying said region of first conductivity-type;

a first polysilicon layer formed at least on said gate oxide layer, said first polysilicon layer being doped with an N or P-type dopant;

a dielectric layer formed on said first polysilicon layer; and a second polysilicon layer formed on said dielectric layer, said second polysilicon layer being doped with the same or different dopant as the first polysilicon layer.

It is noted that the first layer of polysilicon serves as the top electrode of the MOS capacitor as well as the base plate, i.e., base electrode, of the Poly—Poly capacitor.

In one embodiment of the present invention, either the first layer of polysilicon or the second layer of polysilicon is comprised of SiGe.

In one highly preferred embodiment of the present invention, the second layer of polysilicon is comprised of SiGe.

In another embodiment of the present invention, the second layer of polysilicon and the region of first conductivity-type are coupled to a first electrical node and the first layer of polysilicon is coupled to a second electrical node. In this parallel wiring configuration, the stacked Poly—Poly/MOS capacitor of the present invention operates as a high capacitance capacitor since the overall capacitance of the stacked capacitor equals the sum of the capacitance of the individual capacitors, i.e., the MOS capacitor and the Poly—Poly capacitor.

In still another embodiment of the present invention, either the first or second polysilicon layer of the capacitor is coupled to a first electrical node and the region of first conductivity-type is coupled to a second electrical node. In this series wiring configuration, the stacked Poly—Poly/MOS capacitor of the present invention operates as a high voltage capacitor since an inverse capacitance relationship between the two capacitors exists.

It is noted that the stacked Poly—Poly/MOS capacitor of the present invention is used as a component in a BiCMOS device. Thus, the stacked Poly—Poly/MOS capacitor of the present invention may be used in conjunction with conventional complementary metal oxide semiconductor (CMOS) devices, bipolar devices, capacitors or any other like devices that are typically present in a BiCMOS device.

Another aspect of the present invention relates to a process of fabricating the above-defined stacked Poly—

Poly/MOS capacitor. The process of the present invention can be easily implemented into existing BiCMOS processing schemes so as to provide a BiCMOS device that includes at least the stacked Poly—Poly/MOS capacitor of the present invention therein as one of the device components. Specifically, the method of the present invention comprises the steps of:

(a) forming an oxide layer on a surface of a semiconductor substrate containing a region of first conductivity-type, said oxide layer overlaying said region of first conductivity-type;

(b) forming a first polysilicon layer on at least said oxide layer, said first polysilicon layer being doped with an N or P-type dopant;

(c) forming a dielectric layer on said first polysilicon layer; and (d) forming a second polysilicon layer on said dielectric layer, said second polysilicon layer being doped with the same or different dopant as the first polysilicon layer.

The above method may include a wiring step and/or a passivation step which occur after step (d) above. The wiring step includes parallel wiring or series wiring. In parallel wiring, the top electrode, i.e., second polysilicon layer, of the Poly—Poly capacitor is coupled to the base plate, i.e., region of first conductivity-type, of the MOS capacitor through a first electrical node, and the first polysilicon layer is coupled to a second electrical node. In series wiring, the top electrode of the Poly—Poly capacitor or the base plate of the Poly—Poly capacitor is coupled to a first electrical node and the region of first conductivity-type is coupled to a second electrical node.

DETAILED DESCRIPTION OF THE INVENTION

Figure 1:
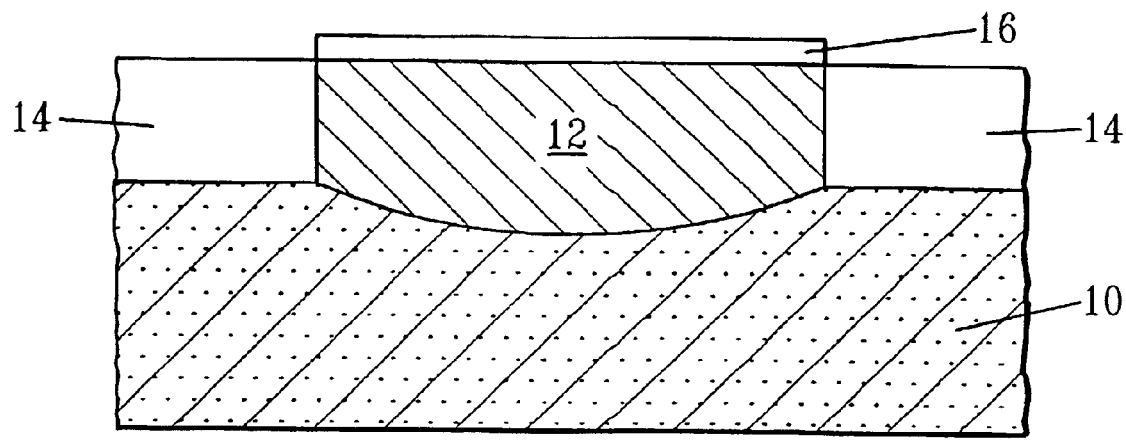
FIGS. 1–4 show the various processing steps that are employed in the present invention in fabricating a stacked Poly—Poly/MOS capacitor of the present invention. It is noted that the drawings show only the capacitor region of a BiCMOS device, the bipolar device regions and CMOS device regions have been omitted for clarity.

The present invention, which provides a stacked Poly—Poly/MOS capacitor and a method of fabricating the same, will now be described in more detail by referring to the drawings that accompany the present application. It should be noted that in the accompanying drawings like and corresponding elements are referred to by like reference numerals.

Figure 4:
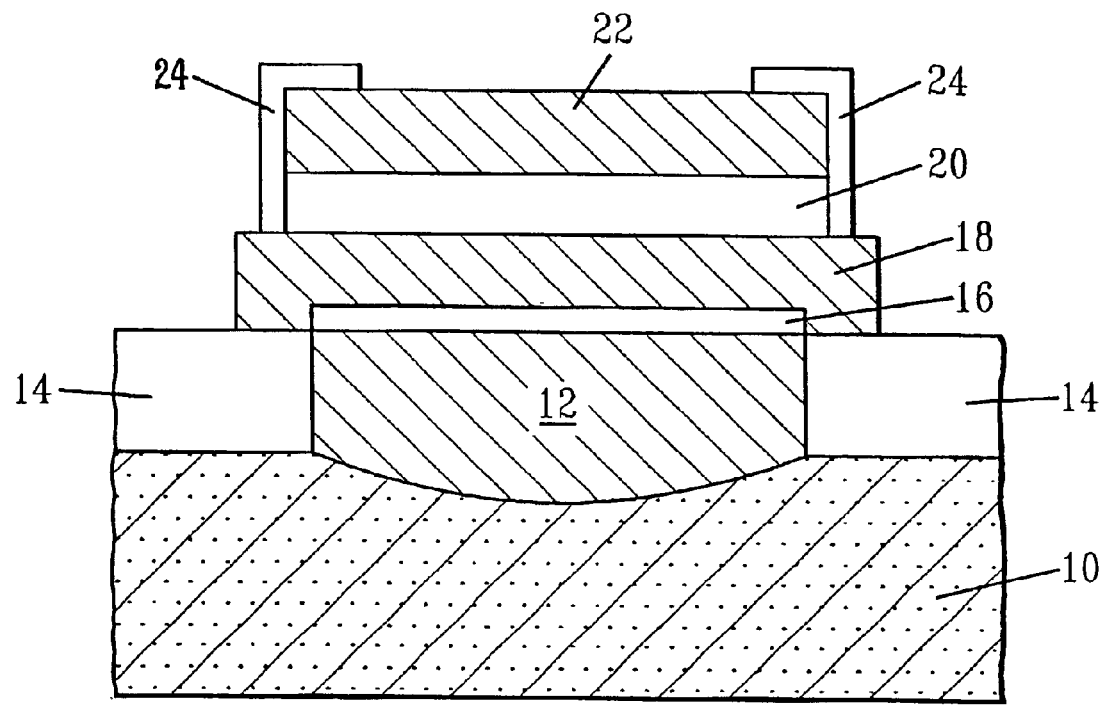

Reference is first made to FIG. 4 which illustrates a basic stacked Poly—Poly/MOS capacitor of the present invention. It is noted that the stacked capacitor shown in the drawing represents one device region of a BiCMOS device. Other device regions including bipolar device regions and CMOS device regions can be formed abutting the stacked Poly—Poly/MOS capacitor shown in FIG. 4. For simplicity, the other device regions of the BiCMOS structure have been omitted.

Specifically, the stacked Poly—Poly/MOS capacitor of FIG. 4 comprises a semiconductor substrate 10 that includes trench isolation regions 14 and a region of a first conductivity-type 12 formed in the substrate between the two trench isolation regions. Although trench isolation regions are depicted and described herein, the present invention also contemplates other types of isolation regions such as LOCOS (local oxidation of silicon) that are fabricated utilizing well known processing techniques. The trench isolation regions may include a liner material that lines the bottom and sidewalls of the trench and a dielectric fill material. The stacked Poly—Poly/MOS capacitor also includes an oxide layer 16 that is formed on the surface of the substrate so as to overlay region 12. A first layer of polysilicon (N or P doped) 18 is formed at least on oxide layer 16; a dielectric layer 20 is formed on first polysilicon layer 18; and a second layer of polysilicon (N or P doped) 22 is formed on dielectric layer 20. In FIG. 4, optional spacers 24 are shown over a top portion of second polysilicon layer 22 as well as sidewalls of second polysilicon layer 22 and dielectric layer 20. Optional spacers 24 include nitride spacers that are formed utilizing a rapid thermal chemical vapor deposition (RTCVD) technique in which the deposition temperature is about 700° C. as well as nitride spacers formed by any other technique.

In the stacked capacitor structure shown in FIG. 4, reference numerals 12, 16 and 18 represent components of the MOS capacitor, while reference numerals 18, 20 and 22 represent components of the Poly—Poly capacitor. Reference numeral 18, i.e., the first polysilicon layer, is a common element that is shared by the MOS capacitor and the Poly—Poly capacitor. The first polysilicon layer thus serves as the top electrode of the MOS capacitor as well as the base plate of the Poly—Poly capacitor.

The method and materials used in fabricating the stacked Poly—Poly/MOS capacitor of FIG. 4 will now be described in more detail by referring to the description that follows. FIG. 1 illustrates an initial semiconductor structure that can be employed in step (a) of the present invention. Specifically, the initial structure shown in FIG. 1 comprises a semiconductor substrate 10 having trench isolation regions 14 and a region of a first conductivity-type 12, i.e., a highly doped diffusion region. The term "highly doped" is used herein to denote a dopant concentration of about $1 \times 10^{19}$ atoms/cm$^3$ or above. The dopant present in region 12 may be an N or P-type dopant depending upon the desired device to be fabricated. In a preferred embodiment of the present invention, region 12 is a heavily doped N+ region. The structure in FIG. 1 also includes an oxide layer 16 that is formed on the surface of the substrate so as to overlay the region of first conductivity-type.

Substrate 10 is composed of any semiconducting material including, but not limited to: Si, Ge, SiGe, GaAs, InAs, InP and all other III/V semiconducting compounds. Layered substrates comprising the same or different semiconducting material, e.g., Si/SiGe or Si/SiO$_2$/Si (SOI), are also contemplated in the present invention. Of these semiconducting materials, it is preferred that the substrate be composed of Si. The substrate may be a p-type substrate or an n-type substrate depending on the type of MOS device to be present in the final BiCMOS structure.

The structure shown in FIG. 1 minus oxide layer 16 is formed utilizing conventional steps that are well known in the art. For example, region 12 is formed by conventional ion implantation and trench isolation regions 14 are formed by conventional trench isolation techniques well known in the art. Since such processing steps are well known in the art, a detailed description concerning the same is not provided herein. It should be noted that the following processing steps used in forming the Poly—Poly/MOS capacitor may be utilized any time during fabrication of the BiCMOS device. That is, the following steps of fabricating the stacked Poly—Poly/MOS capacitor of the present invention can be integrated into any prior art BiCMOS processing scheme during any step of the process.

Oxide layer 16 is formed on the surface of the substrate utilizing a conventional deposition process such as chemical vapor deposition (CVD), plasma-assisted CVD, sputtering, or alternatively oxide layer 16 may be grown thermally.

Following formation of the oxide layer, a first layer of polysilicon 18 (See, FIG. 2) is then formed on oxide layer 16. Thus, the first layer of polysilicon is formed so that it surrounds, i.e., encapsulates, the oxide layer. First polysilicon layer 18 is a heavily doped layer. Specifically, first polysilicon layer 18 contains an N or P-type dopant in a concentration of from about $1\times10^{19}$ atoms/cm$^3$ to about $5\times10^{21}$ or above. More preferably, the concentration of dopant present in the first polysilicon layer is from about $1\times10^{20}$ to about $1\times10^{21}$ atoms/cm$^3$. In one embodiment of the present invention, the first polysilicon layer is comprised of SiGe. In another embodiment of the present invention, the first polysilicon layer is a heavily doped N+ layer.

Figure 2:
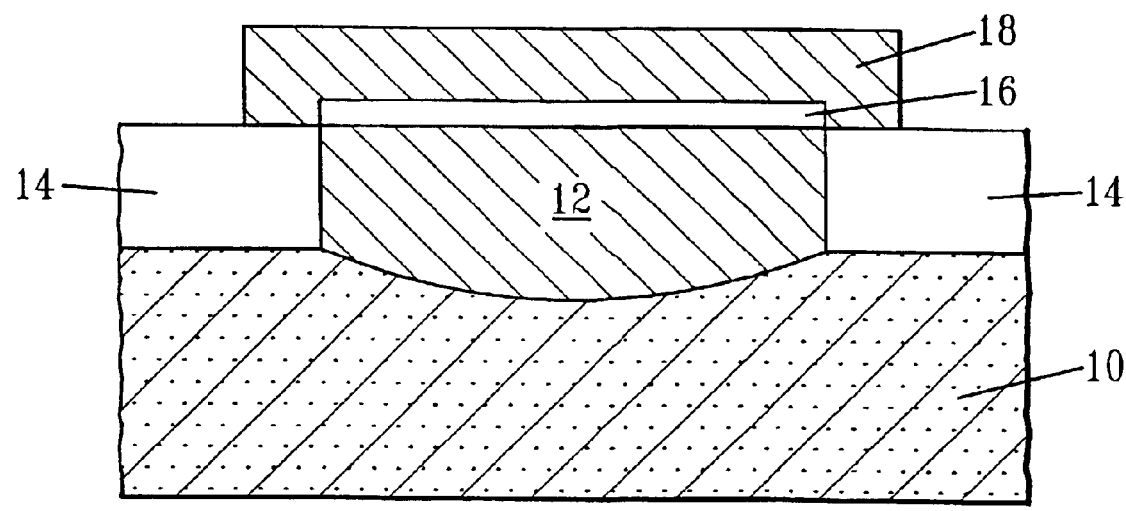

The first layer of polysilicon shown in FIG. 2 is formed utilizing conventional deposition techniques well known in the art including, but not limited to: CVD, plasma-assisted CVD, sputtering, spin-on coating, evaporation and other like deposition processes. The doping may occur after deposition of the polysilicon layer utilizing a conventional ion implantation step, or alternatively, doping may occur in-situ utilizing a conventional in-situ doping deposition process. Following the formation of the polysilicon layer (doped or undoped), the polysilicon layer may optionally be patterned utilizing a conventional patterning technique which includes lithography and etching. The etching step used at this point of the process is a reactive-ion etching (RIE) process that is highly selective in removing polysilicon as compared to $SiO_2$. Any exposed portions of oxide layer 16 may be removed at this point utilizing a chemical wet etch process.

The thickness of first polysilicon layer 18 is not critical to the present invention, but typically the first polysilicon layer has a thickness of from about 1000 to about 2000 Å. It is again emphasized that the first polysilicon layer is the top electrode of the MOS capacitor as well as the base plate of the Poly—Poly capacitor.

Figure 3:
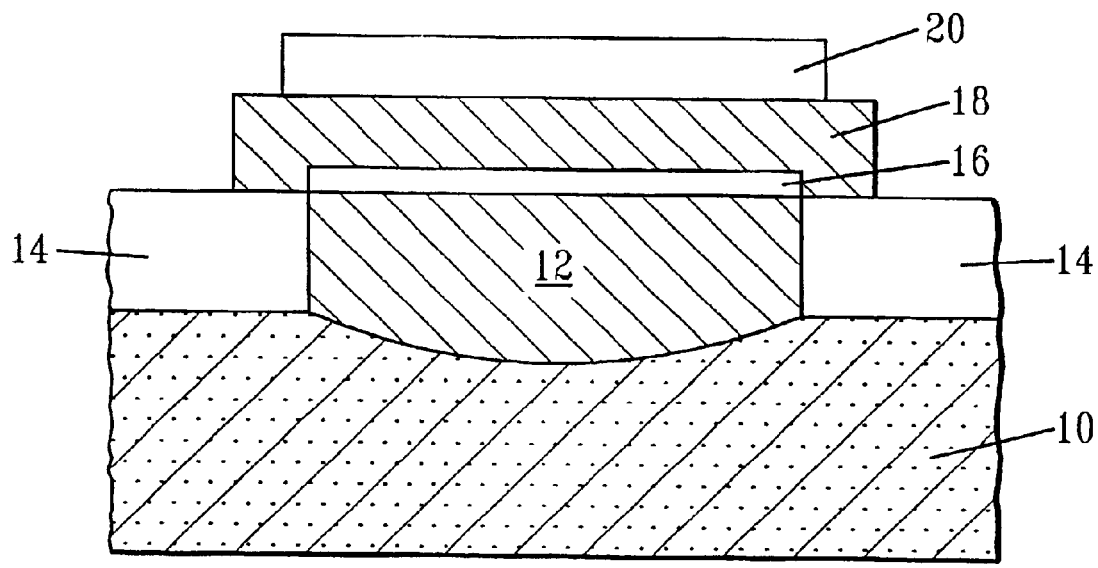

The next step of the present invention is shown in FIG. 3. Specifically, FIG. 3 shows the formation of dielectric layer 20 on the surface of first polysilicon layer 18. The dielectric layer is formed utilizing any conventional deposition technique such as CVD, plasma-assisted CVD, sputtering, evaporation, spin-on coating and the like. Any suitable material that is capable of serving as a dielectric between the first polysilicon layer and the second polysilicon layer may be employed in the present invention as dielectric layer 20. The dielectric may be a high dielectric constant material (k>7) or a low dielectric constant material (k=7 or below). Illustrative examples of some dielectric materials that may be employed in the present include, but are not limited to: $SiO_2$, $Si_3N_4$, polyamides, polyimides, Si-containing polymers, barium strontium titanate, $TiO_2$, $Ta_2O_5$ and other like dielectric materials.

In one embodiment of the present invention, dielectric layer 20 is a high temperature oxide such as is formed utilizing the process described in co-pending and co-assigned U.S. patent application Ser. No. 09/512,721, filed Feb. 24, 2000, the content of which is incorporated herein by reference. Specifically, the-high temperature oxide is formed utilizing a rapid thermal CVD process described in the aforementioned U.S. Patent application.

The thickness of the dielectric layer varies depending on the capacitance requirements of the device to be subsequently fabricated. Typically, however, dielectric layer 20 has a thickness of from about 30 to about 1000 Å, with a thickness of from about 100 to about 200 Å being more highly preferred.

Next, as shown in FIG. 4, a second polysilicon layer 22 is formed on dielectric layer 20. Like first polysilicon layer 18, second polysilicon layer 22 is a heavily doped layer that contains an N or P-type dopant in a concentration of about $1\times10^{19}$ atoms/cm$^3$ or above. More preferably, the concentration of dopant present in the second polysilicon layer is from about $1\times10^{20}$ to about $1\times10^{21}$ atoms/cm$^3$. The dopant present in the second polysilicon layer may be the same or different as that which is present in the first polysilicon layer. In a preferred embodiment of the present invention, the dopant present in the second polysilicon layer differs from the dopant present in the first polysilicon layer. In another highly preferred embodiment of the present invention, the second polysilicon layer is comprised of SiGe (N or P doped). In yet another embodiment of the present invention, the second polysilicon layer is a heavily P+ SiGe layer.

The second layer of polysilicon shown in FIG. 4 is formed utilizing conventional deposition techniques well known in the art including, but not limited to: CVD, plasma-assisted CVD, sputtering, spin-on coating, evaporation and other like deposition processes. The doping may occur after deposition of the polysilicon layer utilizing a conventional ion implantation step, or alternatively, doping may occur in-situ utilizing a conventional in-situ doping deposition process. Following the formation of the second polysilicon layer (doped or undoped), the polysilicon layer may optionally be patterned utilizing a conventional patterning technique which includes lithography and etching. The etching step used at this point of the process is highly selective in removing polysilicon as compared to the dielectric material.

The thickness of second polysilicon layer 22 is not critical to the present invention and it may be the same or different as compared to the first polysilicon layer. Specifically, the second polysilicon layer has a thickness of from about 500 to about 3000 Å. It is noted that the second polysilicon layer is the top electrode of the Poly—Poly capacitor.

FIG. 4 also shows the presence of optional nitride spacers 24 that are formed utilizing conventional deposition techniques and etching. The optional nitride spacers may also be formed utilizing a RTCVD technique wherein the deposition temperature is about 700° C. The etching step used at this point of the present invention is highly selective in removing nitride as compared to polysilicon.

Following the formation of the stacked Poly—Poly/MOS capacitor, other processing steps that are used in fabricating other regions of the BiCMOS device may be conducted.

The stacked capacitor shown in FIG. 4 may be wired utilizing wiring techniques well known to those skilled in the art so as to form a high capacity capacitor or a high voltage capacitor. Specifically, a high capacity capacitor can be formed by coupling second polysilicon layer 22 and region 12 to a first electrical node and by coupling the first polysilicon layer, e.g., layer 18, to a second electrical node that is capable of biasing the first polysilicon layer. In this parallel wiring configuration, the capacitance of the stacked capacitor is equal to the sum of the capacitance of the MOS capacitor and the Poly—Poly capacitor.

Alternatively, a high voltage capacitor can be formed by coupling the second polysilicon layer 22 or first polysilicon layer 18 to a first electrical node and by coupling the base plate of the MOS capacitor, i.e., region 12, to a second electrical node. In a preferred embodiment, second polysilicon layer 22 is coupled to a first electrical node, region 12 is coupled to a second electrical node, and first polysilicon layer 18 is a floating polysilicon layer. In these series wiring configurations, the capacitance has an inverse relationship between the two capacitors and the resulting stacked capacitor can be used in higher voltage applications than when either capacitor is used separately.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a stacked Poly-Poly/MOS capacitor comprising the steps of:
   (a) forming an oxide layer on a surface of a semiconductor substrate containing a region of first conductivity-type, said oxide layer overlaying said region of first conductivity-type;
   (b) forming a first electrode layer so as to encapsulate exposed vertical and horizontal surfaces of said oxide layer, said first electrode layer being doped with an N or P-type dopant and serving as both a top electrode of a metal oxide semiconductor and a base electrode of a capacitor;
   (c) forming a dielectric layer on said first electrode layer; and
   (d) forming a second electrode layer on said dielectric layer, said second electrode layer being doped with the same or different dopant as the first electrode layer, and wherein at least one of said first and second electrode layers comprises SiGe.

2. The method of claim 1 wherein said oxid layer is formed by a deposition process selected from the group consisting of CVD, plasma-assisted CVD and sputtering.

3. The method of claim 1 wherein said oxide layer is formed utilizing a thermal growing process.

4. The method of claim 1 wherein said first electrode layer is formed utilizing a deposition process and an ion implantation step.

5. The method of claim 1 wherein said electrode layer is formed utilizing an in-situ doping deposition process.

6. The method of claim 1 wherein said dielectric layer is a high temperature oxide formed by a rapid thermal chemical vapor deposition process.

7. The method of claim 1 wherein said second electrode layer is formed utilizing a deposition process and an ion implantation step.

8. The method of claim 1 wherein said second electrode layer is formed utilizing an in-situ doping deposition process.

9. The method of claim 1 further comprising forming nitride spacers on at least exposed sidewalls of said dielectric layer and said second electrode layer.

10. The method of claim 9 wherein said nitride spacers are formed by a rapid thermal chemical vapor deposition process at a temperature of about 700° C.

11. The method of claim 1 further comprising a wiring step.

12. The method of claim 11 wherein a parallel or series wiring step is employed.

* * * * *